United States Patent [19]

Ikeda et al.

[11] Patent Number: 5,168,463
[45] Date of Patent: Dec. 1, 1992

[54] SHIFT REGISTER APPARATUS FOR STORING DATA THEREIN

[75] Inventors: Hiroshi Ikeda; Norio Fujiki; Masaki Hirota, all of Kanagawa, Japan

[73] Assignee: Nissan Motor Company, Ltd., Japan

[21] Appl. No.: 314,004

[22] Filed: Feb. 23, 1989

[30] Foreign Application Priority Data

Feb. 23, 1988 [JP] Japan .................................. 63-38719

[51] Int. Cl.⁵ ............................................ G11C 19/00
[52] U.S. Cl. ...................................... 365/78; 365/221;
365/238; 365/183; 307/481; 307/272.3
[58] Field of Search ................. 365/221, 78, 238, 183,
365/189.12, 236, 223, 229, 185; 307/481, 272.3;
357/23.13

[56] References Cited

U.S. PATENT DOCUMENTS

| | | | |
|---|---|---|---|
| 4,092,734 | 5/1978 | Collins et al. | 365/78 |
| 4,321,694 | 3/1982 | Panigrahi et al. | 365/183 |
| 4,418,418 | 11/1983 | Aoki | 377/106 |
| 4,651,303 | 3/1987 | Dias et al. | 365/185 |
| 4,802,136 | 1/1989 | Nose et al. | 365/78 |

FOREIGN PATENT DOCUMENTS

| | | |
|---|---|---|
| 0147019 | 7/1985 | European Pat. Off. . |
| 57-50391 | 3/1982 | Japan . |
| 1506764 | 9/1975 | United Kingdom . |
| 2042296 | 9/1980 | United Kingdom . |

OTHER PUBLICATIONS

"Automobile Technology," Jitosha Gijutsu, vol. 40, No. 10, 1986 pp. 1337-1342 "Development and Application of Driving Data Recorder for Commercial Vehicles" by Nakajima et al. Sequin, C. H., "Two-Dimensional Charge—Transfer Arrays", June 1984, IEEE Journal of Solid-State Circuits, vol. SC-9, No. 3, pp. 134, 135, 138, 139.

Primary Examiner—A. J. Heinz
Assistant Examiner—Alfonso Garcia
Attorney, Agent, or Firm—Lowe, Price, LeBlanc & Becker

[57] ABSTRACT

An apparatus for storing digital data includes a clock pulse source and plural serial shift register stages storing data bits. Digital data signals, each having plural databits, are coupled to and shifted in the stages in synchronization with the clock pulses. Data stored in the memory stages stages are held in a non-erasable memory unit provided for each stage while an emergency causing a failure of a power supply of the shift register occurs.

38 Claims, 7 Drawing Sheets

SHIFT REGISTER APPARATUS FOR STORING DATA THEREIN

BACKGROUND OF THE INVENTION (1) Field of the Invention

The present invention relates to an apparatus for storing data therein and particularly relates to a data storing apparatus for storing various kinds of data and for protectively holding the various kinds of data while a vehicle is running during an unsteady (emergency) state without loss of data.

(2) Background of the Art

In recent years, data storing apparatus for storing various data while a vehicle is running has been installed in the vehicle in order to analyze data stored in the data storage device so that a cause of unsteady operation of the vehicle is determined.

Various types of data storing apparatus have been proposed and developed as exemplified by a Japanese Publication, an automotive engineering volume 40, No. 10, pages 1337 to 1342 (in 1986), and SAE (Society of Automotive Engineers) PAPER 840437 (in 1984).

One of the various types of data storing apparatus disclosed in the above-identified publications is described below.

Various kinds of data relating to running of the vehicle are stored on the basis of a control command by means of an 8-bit microcomputer. The microcomputer is connected to a plurality of interface circuits and a plurality of timer modules via a system interface circuits and a plurality of timer modules via a system bus. The microcomputer processes a variety of information obtained via the interface circuits and/or timer modules.

A first interface circuit transmits switching information from a key switch to a system bus. A second interface circuit transmits a status signal to the system bus. Furthermore, a timer module transmits the measured information from a fuel gage to the system bus. Another timer module transmits speed information from a vehicle speed sensor to the system bus.

A RAM (Random Access Memory) in a working area of the apparatus processes the information obtained via the system bus on the basis of control commands derived from the microcomputer. A RAM data area sequentially stores a variety of data processed by the RAM on the basis of other commands of the microcomputer. In addition, the microcomputer diagnoses causes of unsteady operations of the vehicle on the basis of various types of data stored in the RAM. The results of diagnoses are transmitted to a display unit via a third interface circuit and a display driver to display the results of diagnoses through the display unit.

In the above-described data storing apparatus, in a case where the unsteady operation should occur and/or an accident or trouble should occur, a secondary battery is used to back up the second RAM. Alternatively, an Erasable Programmable Read Only Memory (EPROM), Electrically Erasable Programmable Read Only Memory (EEPROM), or Non-Volatile Random Access Memory (NVRAM) is used as storage means for storing the various data in order to ensure and protect the stored data.

The EEPROM includes address buffers, as well as row and column decoders. The address buffers respond to an addressing word derived (i.e., an address of data to be written is specified) from the microcomputer. The row and column decoders specify a particular memory cell of the memory array. Writing or reading of data is executed in response to a high voltage signal derived from a control circuit for the specified memory cell.

However, since the EEPROM stores data composed of a plurality of bits, a long time is required to execute data write and read questions if a large amount of data is handled. Therefore, the protection of data during unsteady vehicle operation often becomes difficult.

A NVRAM (Non-volatile Random Access Memory) has, in turn, been used in which the RAM and EEPROM are integrated onto a single chip.

The NVRAM usually functions as a RAM and can read or write the data at high speeds from a Random Access portion thereof. In addition, an NV (non-volatile) signal commands, as necessary, writing of data supplied to one input terminal of a logical product circuit in the case of unsteady (or emergency) operation so that data are written at high speeds from the random access portion to the non-volatile portion.

Although the NVRAM can shorten the time required to write data in case of emergency, one of the addresses must be specified when the data are stored in the random access memory portion. Therefore, processing required to store the data becomes complicated.

Although it is possible to use a custom NVRAM in which each address is automatically generated during writing of data into the specified address, a circuit constructed at the periphery of the custom NVRAM becomes complicated, resulting in increased cost.

On the other hand, an LSI (Large Integrated Circuit) composed of a plurality of so-called CMOS (Composite Metal Oxide Semiconductor) transistor circuits as memory cells can form the second RAM to store the data indicating parameter for the running vehicle.

Since there is a limit for the quantity of data to be stored per chip, an improvement is needed for the storing means for storing the large quantity of various data related to running of the vehicle.

SUMMARY OF THE INVENTION

It is an object of the present invention to provide a data storing apparatus which: (a) is simple in construction; (b) easily and quickly stores a large amount of various data as a function of the running of a vehicle; and (c) can protectively hold the data without loss of data in the case of unsteady vehicle operation.

In accordance with the present invention, an apparatus for storing digital data comprises first means for deriving a clock pulse signal and second means having plural serial connected data bit memory stages for storing respective bits of data. Third means controls coupling of plural digital data signals each having plural data bits to the second means in synchronization with the clock pulse signal and shifts the plural data bits toward subsequent data bit memory stages of the second means in synchronization with the clock pulse signal and fourth means, associated with the respective data bit memory stages, holds the data stored in the second means while an emergency causing a failure of a power supply of the second means occurs.

In a preferred embodiment the apparatus for storing digital data derived from plural data sources of a vehicle comprises first means for driving clock pulse signals having the same frequency and reversed phase to each other. Second means having plural data memory stages stores respective bits of the data signals. Third means controls coupling of plural digital data signals each having plural data bits to the third means in synchronization with the clock pulse signal and for shifting the plural data bits toward subsequent data bit memory stages of the second means in synchronization with the clock pulse signal. Fourth means detects an emergency state in the vehicle and protectively holds the respective bits of the data signals in the plural memory stages when the emergency state occurs to prevent transfer thereof toward the subsequent data memory stages.

In accordance with another aspect of the invention an apparatus for storing digital data indicative of the state of a machine at the time an emergency to the machine occurs comprises means for deriving plural multi-bit digital serial signals each indicative of a condition of the machine and an emergency condition sensor for the machine. Multi-stage shift register means including plural serial shift register stages respond to the plural serial signals and a clock source so a different bit storage stage of the shift register means stores a different bit of the plural serial signals. The shift register means responds to the plural serial signals and the clock source so the bits are shifted between the stages in response to the clock source so the bits progress between stages of the shift register means toward output terminal means thereof during non-emergency operation of the machine. Means responsive to the sensing means prevents shifting of the bits between the stages and causes the bits to remain in the stages where they were when the emergency condition was sensed until the emergency condition is no longer sensed.

In the preferred embodiment, each stages includes volatile and non-volatile sections and means responsive to the sensing means transfers the data bit in the volatile section into the non-volatile section and vice versa in response to the clock pulse signals.

In accordance with a further aspect of the invention, an apparatus for storing data related to a state of a vehicle comprises first means for deriving a clock pulse signal having a predetermined period and second means for controlling a plurality of data signals indicative of the vehicle state. Each data signal has plural serial data bits that are sequentially supplied to the data storing apparatus in synchronization with the clock pulse signal. Third means having plural data memory portions stores respective bits of data of the data signal. The third means responds to the first and second means so that the respective bits of data are shifted in the data memory portions toward subsequent data memory portions of the third means in synchronization with the clock pulse signal. Fourth means protectively holds the data stored in the third means while an emergency occurs.

DETAILED DESCRIPTION OF THE PREFERRED EMBODIMENTS

Reference will hereinafter be made to the drawings in order to facilitate understanding of the present invention.

Figure 1:
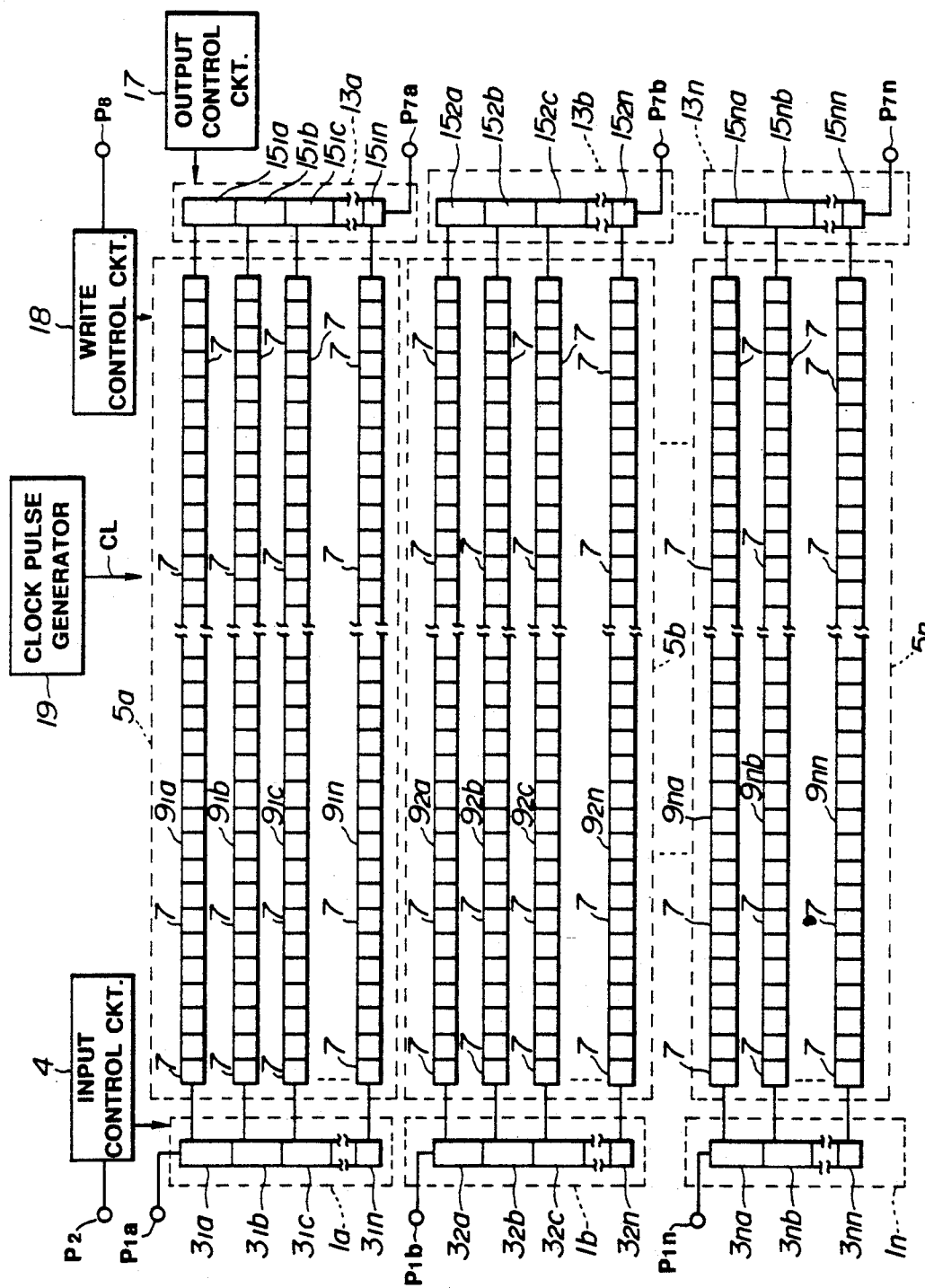
FIG. 1 is a circuit block diagram of a first preferred embodiment of a data storing apparatus according to the present invention.

In FIG. 1 is shown a first preferred embodiment of a data storing apparatus according to the present invention wherein plural register stages are arranged in series with a plurality of data input terminals $1a$, $1b$, ---, $1n$. For example, respective register stages $3_1a$, $3_1b$, $3_1c$, ---, $3_1n$, are connected in series (cascade connection) in a longitudinal direction in data input portion $1a$. In addition, respective register stages $3_2a$, $3_2b$, $3_2b$, ---, $3_2n$ are connected in series in the longitudinal direction in data input portion $1b$. Similarly, respective registers $3_na$, $3_nb$, $3_nc$, ---, $3_nn$ are arranged in series in the longitudinal direction in data input portion $1n$.

The register $3_1a$ is connected to an input terminal $P_1a$. Similarly, the register $3_2a$ is connected to the input terminal $P1b$. The register $3_na$ is connected to the input terminal $P_1n$.

Various data signals related to running of a vehicle are supplied in parallel to a plurality of input terminals $P_1a$, $P_1b$, ---, $P_1n$, respectively. For example, a data signal related to the state of a switch signal is supplied to the input terminal $P_1a$. A data signal indicative of the rotational speed of an engine is supplied to the input terminal $P_1b$. A data signal indicating vehicle running speed derived from a vehicle speed sensor is supplied to the input terminal $P_1\,c$ (not shown). A data signal read from a fuel supply system of the engine is supplied to the input terminal $P_1\,d$ (not shown). Furthermore, data related to various kinds of control signals are supplied to the input terminal $P_1n$.

These respective data indicating the vehicle running condition are constituted by a plurality of bits. Each plural bit data signal is supplied to a corresponding input terminal. Each input portion $1a$, $1b$, ---, $1n$ is connected to be controlled by instructions from the input control circuit 4. That is to say, input control circuit 4 receives an instruction signal from a microcomputer via a terminal $P_2$ to execute an input control for the data on the basis of the supplied instruction signal.

Each of the plural data input portions $1a$, $1b$, ---, $1n$ is connected to a corresponding storage block $5a$, $5b$, $5c$, ---, $5n$. The construction of a typical one of the storage blocks $5a$, $5b$, --, $5n$ is now described in detail.

In the storage block $5a$, a register string $9_1a$ is connected to a register stage $3_1a$. The register string $9_1a$ includes a plurality of shift register stages 7 connected in series in a lateral direction. A register string $9_1b$ is connected to another register stage $3_1b$. The register string $9_1b$ includes a plurality of series shift register stages 7 arranged in the lateral direction. The register string $9_1c$ is connected to another register stage $3_1c$. The register string $9_1c$ includes a plurality of series shift register stages 7. Furthermore, a register string $9_1n$ includes a plurality of shift register stages 7 arranged in series in the lateral direction. The register string $9_1n$ is connected to another register stage $3_1n$.

Each of the other storage blocks $5b$, ---, $5n$ is constructed the same as storage block $5a$. That is to say, a register stage $3_2a$ is connected to a register string $9_2a$. A register stage $3_2b$ is connected to a register string $9_2b$. A register stage $3_2n$ is connected to a register string $9_2n$. In the same way, in the storage block $5n$, a register stage $3_na$ is connected to a register string $9_na$. A register stage $3_nb$ is connected to a register string $9_nb$. A register stage $3_nn$ is connected to a register string $9_nn$.

Each of storage blocks $5a$, $5b$, ---, $5n$ is connected to a corresponding data output portion $13a$, $13b$, ---, $13n$, all of which have the same construction. The construction of a typical one of data output portions $13a$, $13b$, ---, $13n$ is now described in detail.

The data output portion $13a$ includes a plurality of series register stages $15_1a$, $15_1b$, $15_1c$, ---, $15_1n$ arranged in the longitudinal direction. The register stage $15_1a$ is connected to the register string $9_1a$. The register stage $15_1b$ is connected to the register string $9_1b$. The register stage $15_1c$ is connected to the register string $9_1c$. The register stage $15_1n$ is connected to the register string $9_1n$.

The internal construction of the data output portion $13a$ is the same as that of each of the other data output portions $13b$, $13c$, ---, $13n$. In the data output portion $13b$, the register stage $15_2a$ is connected to the register string $9_2a$. The register stage $15_2b$ is connected to the register string $9_2b$. The register stage $15_2c$ is connected to the register string $9_2c$. The register stage $15_2n$ is connected to the register string $15_2n$. In the same way, the register stage $15_na$ is connected to the register string $9_na$. The register stage $15_nb$ is connected to the register string $9_nb$. The register stage $15_nn$ is connected to the register string $9_nn$.

Each of data output portions $13a$, $13b$, ---, $13n$ is connected to be responsive to an instruction signal derived from output control circuit 17. The output terminal $P_7a$ is connected to the register stage $15_1n$. The output terminal $P_7b$ is connected to the register stage $15_2n$. The output terminal $P_7n$ is connected to the register stage $15_nn$. The plural kinds of data stored respectively in the storage blocks $5a$, $5b$, ---, $5n$ in response to instructions derived from the output control circuit 17 are sequentially supplied in serial data form via corresponding output terminals $P_7a$, $P_7b$, ---, $P_7n$, one of which is provided for each of the respective kinds of data.

In addition, a signal for reading data stored in a nonvolatile storage portion NV of shift register 7, as described later, is transmitted to each of the plurality of storage blocks $5a$, $5b$, ---, $5n$, respectively.

The write control circuit 18 is connected to each of the storage blocks $5a$, $5b$, ---, $5n$ for controlling writing of data in an unstable condition such as an emergency.

Figure 2:
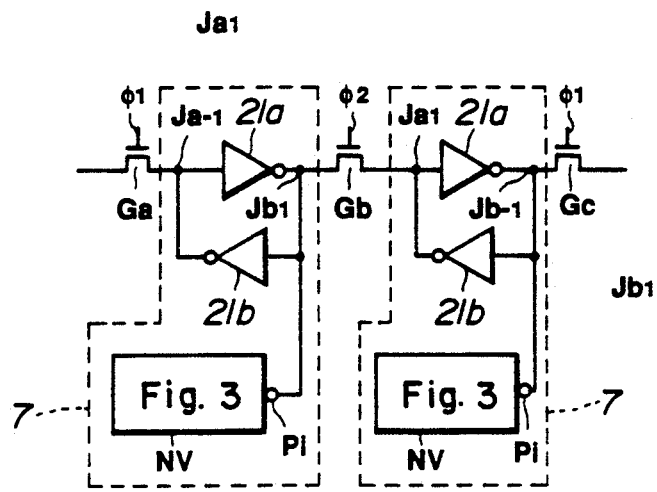
FIG. 2 is a circuit block diagram of an essential portion of FIG. 1.
Figure 4:
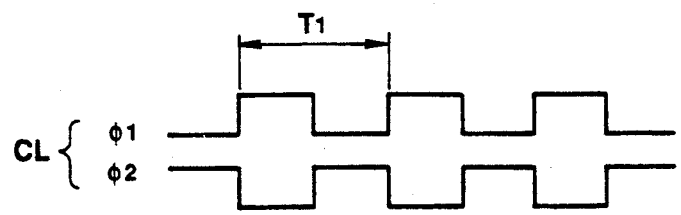
FIG. 4 is a signal timing chart used to help explain a clock pulse transmitted form a clock pulse generator shown in FIG. 1.
Figure 5:
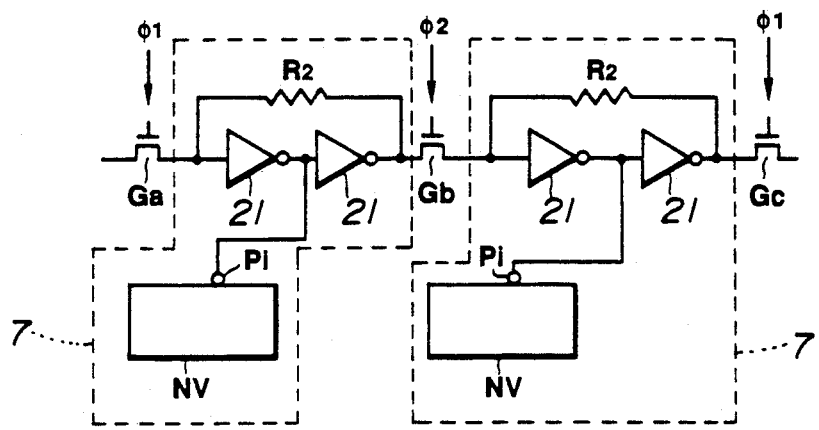
FIG. 5 is a circuit block diagram of a modification of the circuit shown in FIG. 2.

A clock pulse generator 19 includes two shift register stages as shown in FIGS. 2 and 5. As shown in FIG. 4, a clock pulse CL constituted by two clock pulses $\phi_1$ and $\phi_2$, each having a predetermined period $T_1$, is transmitted to each of the plurality of storage blocks $5a$, $5b$, ---, $5n$. Hence, the data stored in each of the shift register stages 7 in the register strings 9 constituting the corresponding storage block are sequentially shifted to the right as shown in FIG. 1, in synchronization with the clock pulse CL having the predetermined period $T_1$. The data shifted sequentially to the right are essentially erased at a trailing (right end of the corresponding register string. Hence, in order to supply a data signal indicative of the vehicle running condition for each predetermined record interval time $T_r$ and to hold a prior data signal for $T_p$ seconds with respect to the present time, a number of shift register stages 7 relatively corresponding to ($T_r/T_p$) and a multi-phase clock pulse corresponding to the shift register stages are needed for each register string.

The internal construction of shift register stage 7, FIG. 1, is now described with reference to FIG. 2.

In FIG. 2, two shift register stages 7 and 7 are shown; each of shift register stages 7 includes two inverters $21a$, $21b$ and a non-volatile memory NV.

Inverter $21a$ is reversely connected to the other inverter $21b$ (i.e., there is a parallel connection of the inverters but the polarity applied thereto is reversed). A data output side of the two inverters is connected to the non-volatile memory NV via a terminal $P_j$. The current drive capability (current supply capacity) of inverter $21b$ is set lower than that of inverter $21a$. A gate $G_b$ is connected between two register stages 7, 7. Respective gates $G_a$ and $G_c$ are connected to other adjacent registers (not shown). Gate $G_a$ receives a predetermined clock pulse $\phi_1$ while gate $G_b$ receives a predetermined clock pulse $\phi_2$. In addition, a predetermined clock pulse $\phi_2$ is supplied to the gate $G_b$. The gate $G_c$ receives the clock pulse $\phi_1$. Hence, the data supplied from the left are sequentially shifted toward the right in synchronization with each of the clock pulses $\phi_1$, $\phi_2$, $\phi_1$. A single memory element includes inverter $21a$ and inverter $21b$. A data bit corresponding to the data bit thus recorded in a single memory stage is stored and held in the non-volatile memory NV. Non-volatile memory portion NV constitutes a means for holding the data bit stored in the memory stage in the unsteady state as in the case of emergency.

Figure 3:
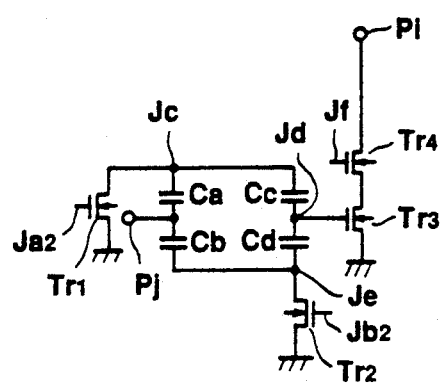
FIG. 3 is a circuit wiring diagram of an essential portion of FIG. 2.

The internal construction of the non-volatile memory portion NV shown in FIG. 2 is illustrated in FIG. 3 as including four MOS type transistors. An electrical potential at terminal $J_a2$ at the gate of the MOS transistor $T_r1$ is set at the same potential as terminal $J_a1$ at an input of the memory element shown in FIG. 2.

If the electrical potential at the junction $J_a1$ at the input of the memory element including inverters $21a$, $21b$ is set at a high (H) level, the electrical potential at the junction $J_a2$ of the non-volatile memory portion NV is also set at the high (H) level. The MOS type transistor $T_r1$ is connected to a capacitor $C_a$ and a capacitor $C_c$ via a junction $J_c$. The capacitor $C_a$ is connected to the capacitor $C_b$. A terminal $P_j$ is connected to a junction between the capacitors $C_a$ and $C_b$. The terminal $P_j$ is connected to a write control circuit 18 shown in FIG. 1. When the data are stored in the non-volatile memory portion NV from the corresponding memory element, a high voltage pulse from the write control circuit 18, e.g., a voltage pulse from about 15 volts to about 25 volts, is applied to the terminal $P_j$.

The timing of the high voltage pulse which is to be transmitted from the write control circuit 18 is now explained. While the write control circuit 18 monitors the transmission of the clock pulse CL from the clock pulse generator 19, the transmission of the high voltage pulse is inhibited in a state where the clock pulse CL is transmitted from the clock pulse generator 19. That is to say, in a case where a signal indicating that the circuit is in the unsteady state, such as in the case of emergency, is received via the terminal $P_8$, the write control circuit 18 transmits the high voltage pulse to the terminal $P_j$ of the non-volatile memory portion NV upon completion of transmission of the clock pulse CL from the clock generator 19.

In addition, the terminal $P_j$ is connected to the output control circuit 17. When the data stored and held in the non-volatile memory portion NV are read, a predetermined reference voltage $V_r$ is supplied to the terminal $P_j$; voltage $V_r$ is lower than the pulse voltage of the high voltage pulse as the signal indicating that the data held from the output control circuit 17 are read.

A series circuit constituted by the capacitors $C_a$ and $C_b$ is connected in parallel with a series circuit constituted by the capacitors $C_c$ and $C_d$.

The capacitor $C_d$ is constituted by a thin film capacitor, for example, formed of an oxide thin film having a film thickness of about 100. The capacitor $C_d$ is connected to a MOS type transistor $T_r2$ via a junction $J_e$. The electrical potential at the junction $J_b2$ of the gate of the MOS type transistor $T_r2$ is set at the same potential as that of the output end of the memory element corresponding to FIG. 2.

When the junction $J_{b1}$ at the output side of the memory element is formed with the two inverters 21a, 21b at the L (low) level, the electrical potential at the junction $J_b2$ of the non-volatile memory portion NV is also set at the L level.

A junction between the capacitors $C_c$ and $C_d$ is connected to the gate of the MOS type transistor $T_r3$ having a current output. In a case where the electrical potential at the gate side, i.e., the junction $J_d$, is at a predetermined threshold voltage $V_{th(}$, this case corresponds to the case where the data at the junction $J_{a1}$ at the input side of the corresponding memory element are at the high (H) level. On the contrary, in a case where the electrical potential at the junction $J_d$ is at a threshold voltage $V_{thh}$ higher than the threshold voltage $V_{th(}$, the data in a case where the electrical potential at the junction $J_{a1}$ at the output side of the corresponding memory element are at the L level.

The MOS type transistor $T_r3$ is connected to the corresponding memory element via the MOS type transistor $T_r4$ and terminal $P_i$. The junction $J_f$ at the gate of the MOS type transistor $T_r4$ is connected to the output control circuit 17. A switching operation is carried out on the basis of the signal from the output control circuit 17.

Next, consider operation of the circuit while it holds the data during an unstable state such as the case of emergency.

Each data bit is sequentially shifted into a subsequent shift register stage in the plurality of series-connected shift register stages of the plurality of shift register strings. From among the plurality of series-connected shift register stages 7, the particular shift register stages 7 as shown in FIG. 2 will be described.

Suppose that the junction $J_{a1}$ of two inverters 21a, 21b, shown in FIG. 2 at the input side of the memory element, is at the high (H) level and the junction $J_{b-1}$ at the output side of the memory element is at the low (L) level side. In addition, suppose that the write control circuit 18 shown in FIG. 1 is responsive to a signal at terminal $P_8$, the signal on the unsteady state such as the emergency signal derived from the sensor. The write control circuit 18 transmits a predetermined high voltage pulse to a terminal $P_j$ of the non-volatile memory portion NV shown in FIG. 3. Since the junction $J_{a1}$ at the memory element side is at the high (H) level, the junction $J_{a2}$ at the non-volatile memory portion NV is also set to the high (H) level. Similarly, since the junction $J_{b1}$ at the output of inverter 21a is also set to the L (low) level, the junction $J_b2$ at the non-volatile memory portion NV is also set to the low (L) level.

Since the junction $J_{a2}$ shown in FIG. 2 is at the high (H) level, the MOS type transistor $T_r1$ conducts. In addition, since the junction $J_{b2}$ is at the low (L) level, the MOS type transistor $T_r2$ is set to the off state. When a predetermined high voltage pulse is supplied to the terminal $P_j$ with the junction $J_{b2}$ at the low (L) level, the MOS type transistor $T_r2$ is set to the off state.

In this way, when the junction $J_{a2}$ is at the high level and the junction $J_{b2}$ is set at the L level, a predetermined high voltage pulse is supplied to the terminal $P_j$ with the junction $J_{b2}$ set at the low level (L). At this time, the electrical potential at the junction $J_c$ is pulled up with the electrical potential of the junction $J_e$ maintained at zero volts. That is to say, the applied voltage at the junction $J_e$ is supplied across both terminals of the capacitor $C_d$. Therefore, a so-called tunnel effect occurs and the electrons are discharged from the junction through the oxide film of the capacitor $C_d$. If the described tunnel effect occurs, the electrical potential at the junction $J_d$ is decreased. The voltage junction $J_d$ at the MOS type transistor $T_r3$ is lowered and is set to the predetermined threshold voltage $V_{th(}$. In this way, since the electrical potential of the junction $J_d$ at the gate of the MOS type transistor $T_r3$ is set to the predetermined threshold voltage $V_{th(}$, the junction $J_{aa1}$ at the memory element side corresponds to the case where the junction $J_{a1}$ at the memory element side is at the high (H) level data.

Non-volatile memory portion NV stores the data at junction $J_{a1}$ at the input side of the memory element if the data is at a low (L) level. The reverse operation is carried out under these circumstances. That is to say, with the junction $J_{a2}$ set at the low (L) level, the junction $J_{b2}$ is set at the high (H) level. A predetermined high voltage pulse from the write control circuit 18 is supplied to the terminal $P_j$ under such a state. At this time, the electrons are injected through the thin film of the capacitor $C_d$ into the junction $J_d$. The electrical potential of the junction $J_d$ at the gate of the MOS type transistor $T_r3$ is set to the predetermined threshold voltage $V_{thh}$ so that the junction $J_{a1}$ at the memory element side is at the low (L) level.

As described above, the data of the memory element at the electrical potential of the MOS type transistor $T_r3$ are set according to the data of the memory element. Therefore, the protective holding of data of the memory element is assured.

Consider now how the circuit of FIG. 2 analyzes the stored data in the non-volatile memory portion NV during unstable operation.

When data stored in the non-volatile memory portion NV are read, a predetermined reference voltage $V_r$ is supplied by output control circuit 17 to the terminal $P_j$. As the value of the reference voltage $V_r$ changes, the electrical potential at the junction $J_d$ is set to the voltage $V_{th(}$. With the MOS type transistor $T_r3$ turned on, the electrical potential at the junction $J_d$ is set at the predetermined threshold voltage $V_{thh}$. On the contrary, in a case where the electrical potential at the junction $J_d$ is set to the predetermined threshold voltage $V_{thh}$, the voltage is set to turn off the MOS type transistor $T_r3$.

Hence, with a predetermined reference voltage $V_r$ supplied by the output control circuit 17 to the terminal $P_j$, the MOS type transistor $T_r3$ is turned on or off according to the value of the threshold voltage of the junction $J_d$.

Next, for example, assume that the signal to turn on the MOS type transistor $T_r4$ from the output control circuit 17 is supplied to the junction $J_f$ at the gate side of the MOS type transistor $T_r4$ to turn transistor $T_r4$ on or off.

A signal to turn on the MOS type transistor $T_r4$ from the output control circuit 17 is supplied to the junction $J_f$. With the MOS type transistor $T_r4$ turned on, junction $J_{b1}$ at the memory element side is set to the low (L) level in a case where the threshold voltage at the junction $J_d$ is $V_{th(}$. With the junction $J_{b1}$ at the memory element side set to the (L) low level, the junction $J_{a1}$ is set at the low (L) level. In the case where the threshold voltage at the junction $J_d$ is at the voltage $V_{thh}$, the junction $J_{b1}$ at the memory element side is set to the high level (H) and the junction $J_{a1}$ is set to the low (L) level.

The original data according to the value of the threshold voltage of the junction are read into the shift register stage including inverters 21a, 21b.

Next, the clock pulse generator 19 is operated in response to control instructions derived from the output control circuit 17. The predetermined clock pulse CL is supplied to respective register strings including series shift register stages.

In this way, the data read from the non-volatile memory portion NV is sequentially shifted to the subsequent shift register stage in synchronization with the predetermined clock pulse. The data for each sequentially shifted bit is in the serial data form at the data output portion and derived from the corresponding output terminal.

The data bits for the time $T_p$ prior to the time during which the unsteady state are generated as described above can be analyzed.

The clock pulse generator 19 shown in FIG. 1 can be incorporated into the input control circuit 4 or output control circuit 17.

In addition, in the preferred embodiment shown in FIG. 1, a single input terminal and a single output terminal are installed for each type of data indicating vehicle operation. The circuit construction can furthermore be simplified since the data input portion and data output portion can be eliminated.

Another example of the shift register 7 shown in FIG. 2 is with reference to FIG. 5.

In FIG. 5 are shown two register stages 7 and 7, each including two series connected inverters 21, resistor $R_2$, and non-volatile memory portion NV. Resistor $R_2$ is connected in parallel with the two series-connected inverters 21. The non-volatile memory portion NV is connected via the input terminal $P_i$ to a terminal between inverters 21 of a single shift register stage.

Gates $G_a$ and $G_c$ are connected between two adjacent shift register stages 7, 7 as shown in FIG. 5. One of register stages 7 is connected between a pair of register stages, only one of which is illustrated. While a predetermined clock pulse $\phi_1$ is supplied to the gate $G_c$, the gate $G_b$ receives the complementary clock pulse $\phi_2$. In addition, the clock pulse $\phi_1$ is transmitted to the gate $G_b$. Hence, the data supplied from the left direction are shifted toward the right in synchronization with the predetermined clock pulses $\phi_1$, $\phi_2$, and $\phi_1$. In addition, in an unsteady state, such as the case of emergency, the data of the shift register stage 7 including a pair of series inverters 21 and resistor R are protectively held in non-volatile memory portion NV.

Although, as shown in FIGS. 2 and 5, a gate is installed between each shift register stage, the present invention is not limited to the embodiments shown in FIGS. 2 and 5. The gate can be part of these register stages.

Figure 6:
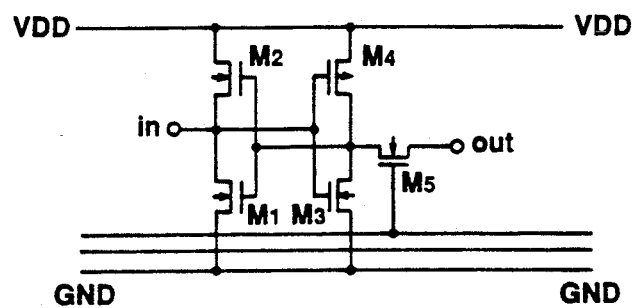
FIG. 6 is a circuit block diagram of another modification of the circuit shown in FIG. 2.

The shift register stages 7 shown in FIG. 1, can be integrated circuits including five transistors $M_1$, $M_2$, $M_3$, $M_4$, and $M_5$ as shown in FIG. 6.

If the integrated circuit shown in FIG. 6 constitutes each shift register stage, the number of transistors of each stage and the cost are accordingly reduced.

A second preferred embodiment according to the present invention is now described with reference to FIG. 7 wherein a plurality of series connected shift register stages 7 of memory block 5 store data representing operation of the vehicle. The data are sequentially shifted in the form of the serial data.

The serial converter 2 is connected to a plurality of input terminals $P_a$, $P_b$, ---, $P_n$, respectively. These respective input terminals $P_a$, $P_b$, $P_c$, ---, $P_n$ receive data representing vehicle running conditions, e.g., data representing (a) switch signal conditions, (b) engine speed, (c) running speed from the vehicle speed sensor, (d) fuel gauge, and (e) various control signals according to the allocation of the terminals to the data. These data are constituted by a plurality of bits. The various kinds of data indicating the vehicle running conditions are in serial data form and include plural bits supplied via input terminals $P_a$, $P_b$, $P_c$, ---, $P_n$, to serial conversion circuit 2.

The plural kinds of data supplied via input terminals $P_a$, $P_b$, $P_c$, ---, $P_n$, are converted into a previously set order of the serial data. The converted serial data are transmitted sequentially to the memory block 5.

The serial conversion circuit 2 is controlled in response to instructions derived from the input control circuit 3. The serial conversion circuit 2 includes a clock pulse circuit for receiving the clock pulse CL having the predetermined period. The clock pulse CL is transmitted to the memory block 5 and counter 11a.

The serial data derived from the serial conversion circuit 2 are sequentially shifted toward the right in synchronization with the clock pulse CL having the predetermined period. The sequentially shifted serial data are sequentially erased in the last shift register stage 7 in the memory block 5. Hence, in a case where the interval of time required to store the data on the vehicle is $T_r$, the duration of an unstable interval is $T_p$, and the bits of serial data are received from the serial conversion circuit 2 during interval $T_r$, the number (N) of shift register stages 7 required to hold the prior data is $$N = K \times T_r / T_r$$

Figure 7:
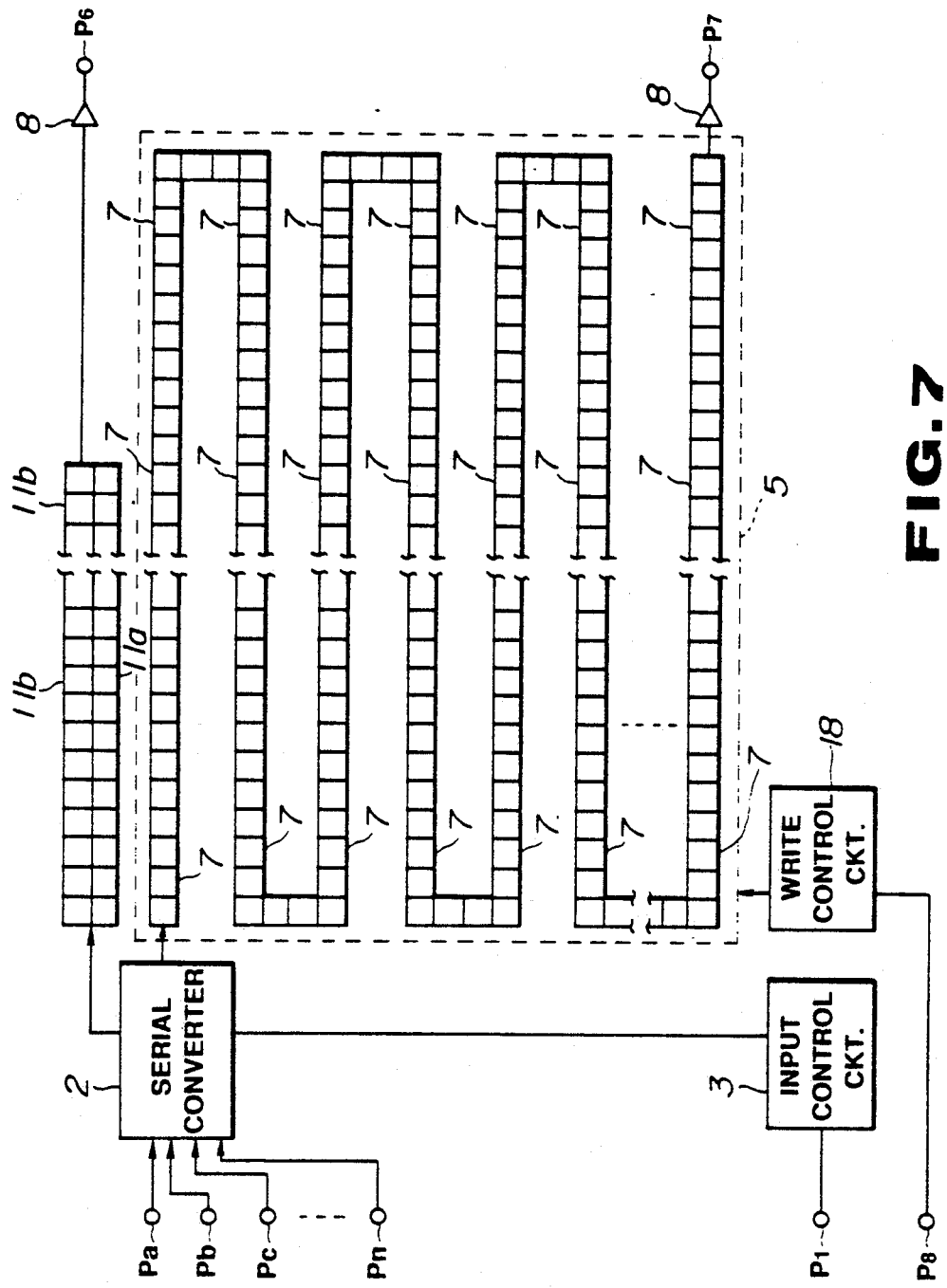
FIG. 7 is a circuit block diagram of a second preferred embodiment of a data storing apparatus according to the present invention.

The system of FIG. 7 also includes plural counters 11a for indicating the position of the data signal present in the memory block 5. Non-volatile memory portion 11b is included for each of the plurality of counters 11a. The positions of the plural kinds of data signals are recorded by counting the clock pulse CL having the predetermined period transmitted from the serial conversion circuit 2. The position of data thus recorded are stored and held in the non-volatile memory portion 11b correspondingly installed.

The number M of the plurality of counters 11a is:

$$M = \log_2 N$$

In addition, information for the position of the data signal stored in the non-volatile memory portion 11b is derived via the buffer circuit 8 and terminal $P_6$.

The buffer circuit 8 is controlled in response to control instructions derived from the write control circuit 18. The buffer circuit 8 is set to an output inhibit state for a predetermined time while the data signal indicating vehicle running condition is supplied to the memory.

Suitable shift register stages as shown in FIG. 5 or FIG. 6 may be used as the plurality of shift register stages 7.

In addition, a non-volatile memory portion 11b may be used as the non-volatile memory portion 11b shown in FIG. 3.

In the example shown in FIG. 7, a plurality of input terminals are installed, one for each kind of data signal related to operation of the vehicle. A plurality of input terminals may be installed for each of the plural kinds of data signals.

Circuit construction of the data memory apparatus may be simplified if (a) a single input terminal is installed in place of the plural input terminals, (b) the serial conversion circuit 2 is installed externally, and (c) the data are derived from the serial conversion circuit 2 via the single input terminal.

A third preferred embodiment of the data storing apparatus is now described with reference to FIGS. 8 to 12.

Figure 8:
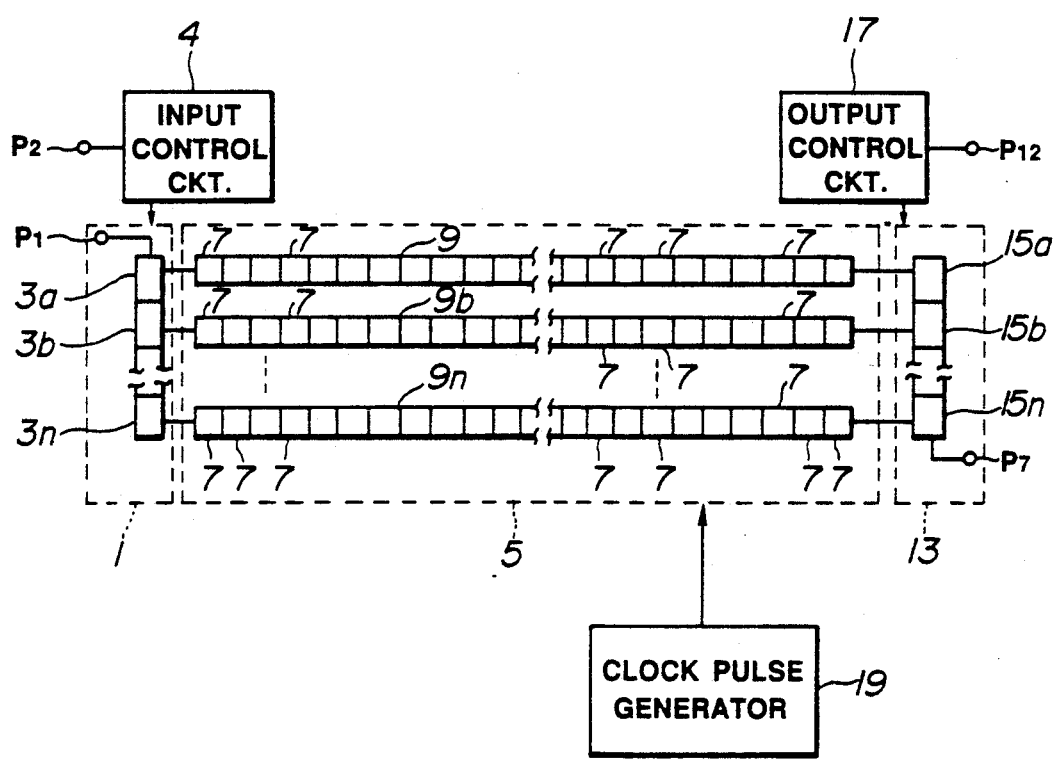
FIG. 8 is a circuit block diagram of a third preferred embodiment of a data storing apparatus according to the present invention.

As shown in FIG. 8, the data input portion 1 includes series registers 3a, 3b, 3c, ---, 3n arranged in the longitudinal direction. Register 3a is connected to the input terminal $P_1$. Various kinds of data signals indicative of the vehicle running condition are represented by the plural bits. The various data signals including plural bits are sequentially supplied to input terminals $P_1$. Data input portion 1, controlled in response to instructions derived from input control circuit 4, is connected to input control circuit 4 and memory block 5.

The details of the construction of memory block 5 are now described.

Register string 9a includes plural series shift register stages 7 arranged in the lateral direction. Register stage 3b is connected to the first stage of register string 9b, including plural series shift registers 7 arranged in the lateral direction. Register stage 3c is connected to the first stage of register string 9c, including plural series register stages 7 arranged in the lateral direction. Furthermore, register stage 3n is connected to the first stage of register string 9n including plural series register stages 7, arranged in the lateral direction.

Memory block 5 is connected to supply data bits to data output portion 13, including plural series register stages 15a, 15b, 15c, ---, 15n extending in the longitudinal direction. The register stages 15a, 15b, ---, 15n are respectively connected to respond to the bits in the last stages of register strings 9a,, Output terminal P is connected to the register 9b, ---, 9n. Output terminal $P_7$ is connected to the register stage 15n. Data output portion 13 is controlled in response to instructions derived from output control circuit 17. Different kinds of data signals stored in memory block 5 in response to instructions derived from output control circuit 17 are sequentially derived via terminal $P_7$ for each kind of data.

Clock pulse generator 19, constructed the same as the example shown in FIG. 1, derives clock pulse CL having a predetermined period and wave shape as shown in FIG. 4.

Structure for backing-up storing apparatus 33, FIG. 8, is now described with reference to FIG. 9.

Figure 9:
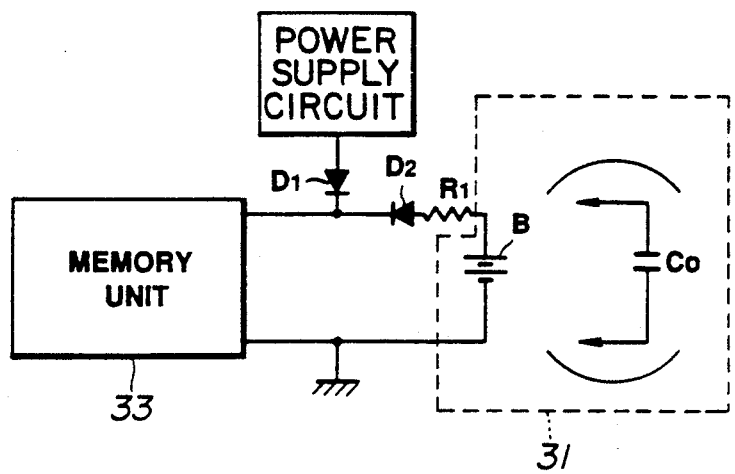
FIG. 9 is a circuit block diagram of an essential portion of the circuit shown in FIG. 8.

Data storage apparatus 33, FIG. 9, is connected to a predetermined DC power supply E via diode $D_1$. A predetermined power supply voltage is supplied by DC power supply E to data storage apparatus 33 via diode $D_1$, connected in the forward bias direction. In addition, data storage apparatus 33 is connected to battery B via a diode $D_2$ and resistor $R_1$. If DC power supply E is broken and/or is in the unsteady state, power from battery B is supplied to the data storage apparatus 33 via resistor $R_1$ and diode $D_2$.

Alternatively, in place of the battery B, a capacitor $C_o$, having a predetermined capacity, is connected to the data storage apparatus 33. During normal operation, capacitor $C_o$ is charged by the power supply to a predetermined DC power supply voltage E. In the case of unstable operation in which the power from the DC power supply is interrupted, the charged voltage from capacitor $C_o$ is supplied to the data storage apparatus.

Standby power supply circuit 31, including battery B or capacitor $C_o$, constitutes means for holding the data stored in the data storage apparatus 33 in a case where the power supply is interrupted.

Figure 10:
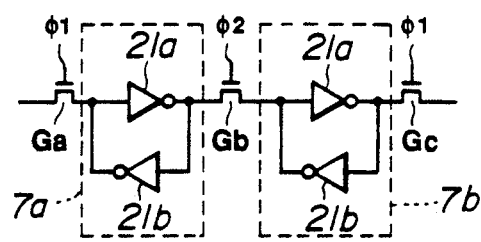
FIG. 10 is an internal circuit wiring diagram of the circuit shown in FIG. 8.

FIG. 10 is a circuit diagram of the internal construction of each shift register stage 7 shown in FIG. 8.

In FIG. 10, two shift register stages 7, 7 are shown, each including inverters 21a and 21b that are connected in parallel to each other in mutually reversed directions. The current drive capability of inverter 21b is lower than that of inverter 21a.

When the gate $G_b$ is open, the data of the shift register 7a are supplied to and latched in shift register stages 7b. Clock pulse $\phi_2$ is supplied to gate $G_b$ connected between inverter 21a of shift register stage 7a and inverter 21a of shift register stage 7b. A clock pulse $\phi_1$ is supplied to gates $G_a$ and $G_c$, respectively connected to the input/output of stages 7a and 7b. Hence, the data supplied via gate $G_a$ to stage 7a is sequentially shifted to the right in synchronism with clock pulse $\phi_1$.

Figure 11:
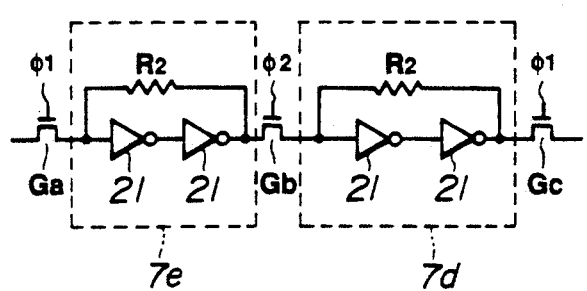
FIG. 11 is a circuit block diagram of another circuit construction of a shift register stage shown in FIG. 8.

Another example of shift register stages 7 shown in FIG. 8 is now described with reference to FIG. 11. A gate $G_b$ is connected between each of the shift register stages 7c and 7d, while gates $G_a$ and $G_b$ are respectively connected between stages 7c and 7d of the shift register stages (not shown) adjacent stages 7c and 7d. Clock pulses $\phi_1$, $\phi_2$, and $\phi_1$ are respectively supplied to gates $G_a$, $G_b$, and $G_c$. Hence, data supplied to gate $G_a$ are sequentially shifted to the right in synchronism with clock pulses $\phi_1$, $\phi_2$, and $\phi_1$.

Figure 12:
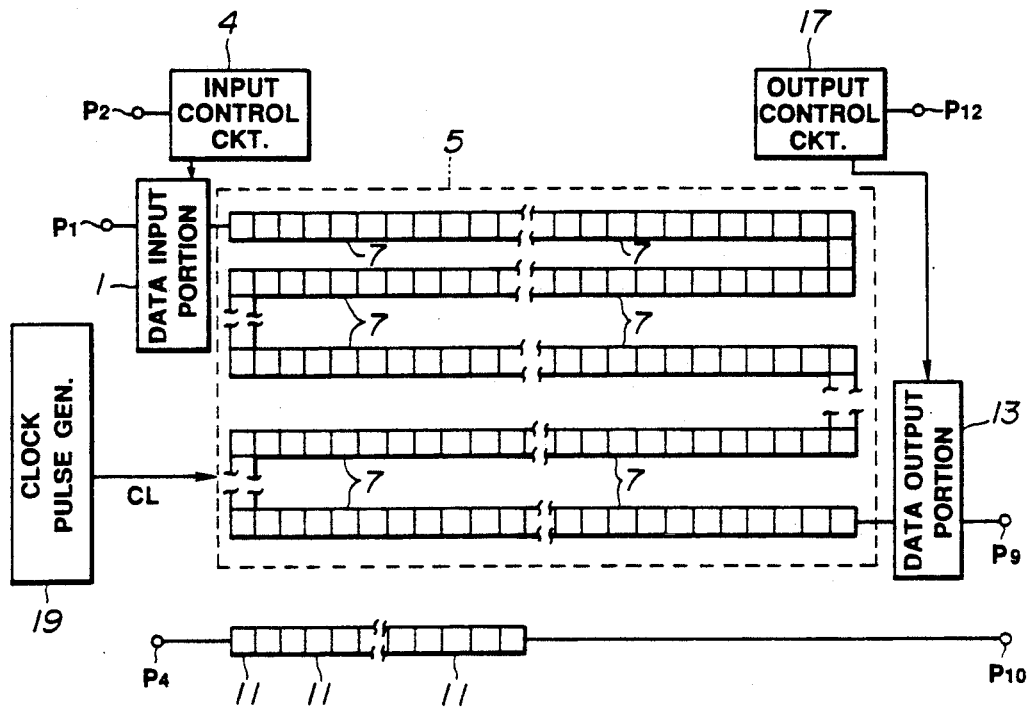
FIG. 12 is a circuit block diagram of a modification of the circuit shown in FIG. 8.

Another example of the data storage apparatus shown in FIG. 8 is now described with reference to FIG. 12 wherein plural series shift register stages 7 are included in memory block 5. Plural serial data signals are sequentially supplied by data input portion 1 to an input terminal of the initial stage 7 of the multistage register comprising memory 5. At this time, the data supplied by portion 1 to memory 5 are sequentially shifted in synchronization with clock pulse CL supplied to memory block 5. In FIG. 12, counter 11 indicates the position of various kinds of data in storage block 5.

In the preferred embodiment shown in FIG. 12, plural kinds of data bits supplied to terminal $P_1$ are sequentially shifted as bits, to the plural series shift register stages 7 constituting memory block 5. This leads to simplified construction of the data input portion 1 and data output portion 13. If the shift register stage 7 shown in FIGS. 8 and 12 has a non-volatile memory portion NV, as shown in FIG. 2 or FIG. 5, the information related to vehicle operation can be more protectively stored and held.

Figure 13:
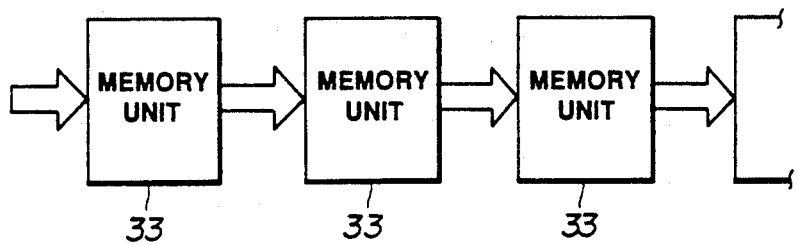
FIG. 13 is a circuit block diagram of a fourth preferred embodiment of a data storing apparatus according to the present invention.

A fourth preferred embodiment of the data storing apparatus according to the present invention is now described with reference to FIG. 13 wherein plural memory units 33 of the type illustrated in FIGS. 8 or 12 are connected in series. Each of units 33 includes multiple shift register stages 7 having a non-volatile memory portion NV. Shift register stages thus shown in FIG. 6, may be used in units 33. Although it is necessary to provide additional data addresses to accommodate the expanded memory capacity of the data storing apparatus of FIG. 13, a mere direct connection is employed between the various units and the modification can easily be made.

Although erasing and writing of data must be performed repeatedly for the previously proposed data storing apparatus, the mere writing of data results in the sequential and automatic storage of data. Data stored in the storage means during unstable operation are held by a simple holding means. High speed processing with a low-cost apparatus is possible, compared with the case where control of erasing and writing of data are always performed. The data are protectively secured in the memory even if there is unstable operation as in the case of emergency.

It will be fully appreciated by those skilled in the art that the foregoing description has been made in terms of the preferred embodiments and various changes and modifications may be made without departing from the scope of the present invention which is to be defined by the appended claims.

What is claimed is:

1. An apparatus for storing digital data therein comprising:
   a) first means for deriving a clock pulse signal;
   b) second means having plural serial connected data bit memory stages for storing respective bits of data;
   c) third means for controlling coupling of plural digital data signals each having plural data bits to the second means in synchronization with the clock pulse signal and for shifting the plural data bits toward subsequent data bit memory stages of the second means in synchronization with the clock pulse signal; and
   d) fourth means, associated with the respective data bit memory stages, for holding the data stored in the second means wile an emergency causing a failure of a power supply of the second means occurs.

2. An apparatus as set forth in claim 1, wherein the third means includes a plurality of data input portions, each data input portion including a plurality of shift registers connected in series with one another and a data input terminal for receiving each of the plural data signals, and an input control circuit for executing input control of each data input portion in response to a command.

3. An apparatus as set forth in claim 2, wherein the second means includes a plurality of shift register strings, each including plural series connected shift register stages, a first stage of each shift register string being connected to respond to a bit in one of the shift register stages of each data input portion.

4. An apparatus as set forth in claim 3, wherein the fourth means includes fifth means for deriving an emergency signal in response to an unstable state occurring in a machine deriving the data signals, and a write control circuit responsive to the emergency signal from the fifth means for deriving a high voltage pulse for each shift register stage of each shift register string for protectively holding the data bits stored in each shift register string.

5. An apparatus as set forth in claim 4, which further comprises sixth means for deriving the plurality of data bits stored in the second means in synchronization with the clock pulse signal in response to a write command.

6. An apparatus as set forth in claim 4, wherein each shift register stage of each register string in the second means includes: a) a transmission gate connected between a pair of adjacent shift register stages for passing each shifted data bit therethrough in response to the clock pulse signal derived from the first means, b) first and second inverters, the first inverter being connected to the transmission gate and in parallel with the second inverter in a mutually reverse direction, the first inverter having a greater current supplying capacity than the second inverter, and a non-volatile memory portion having a first terminal for receiving the high voltage pulse from the write control circuit and a second terminal connected to the pair of the first and second inverters.

7. An apparatus as set forth in claim 6, wherein the non-volatile memory portion includes: a) a first MOS type transistor connected to ground, the first transistor being turned on or off in response to the value of a data bit at an input of the first inverter; b) a second MOS type transistor connected to ground, the second transistor being turned on or off according to the value of a data bit at an output side of the first inverter; c) a first capacitor connected between the first MOS type transistor and the first terminal, a second capacitor connected between the first terminal and the second MOS type transistor, a third capacitor connected to the first MOS type transistor, and a fourth capacitor connected between the second MOS type transistor and third capacitor; d) a third MOS type transistor having a gate connected to a junction between the third and fourth capacitors, and e) a fourth MOS type transistor connected between the third MOS type transistor and the second terminal.

8. An apparatus as set forth in claim 7, wherein the fourth capacitor is a thin film capacitor.

9. An apparatus as set forth in claim 7, wherein the clock pulse signal supplied to the transmission gate has a higher priority than the high voltage pulse supplied to the first terminal.

10. An apparatus as set forth in claim 4, wherein each shift register stage of each shift register string in the second means includes a transmission gate connected to an adjacent one of the shift register stages for passing each shifted data bit therethrough in response to the clock pulse signal from the first means, a pair of first and second inverters, the first inverter connected to the transmission gate and to an input side of the second inverter and having a higher current supplying capacity than the second inverter, a feedback resistor connected between an input side of the first inverter and an output side of the second inverter, and a non-volatile memory portion having a first terminal for receiving the high voltage pulse from the write control circuit and a second terminal connected to the pair of inverters.

11. An apparatus as set forth in claim 10, wherein the second means comprises a string of shift register stages having the plural series connected shift register stages.

12. An apparatus as set forth in claim 11, which further comprises a plurality of counting circuits for deriving a signal indicative of the position of each data signal in the string of the shift registers in synchronization with the clock pulse signal.

13. An apparatus as set forth in claim 12, wherein the first means is included in the input control circuit.

14. An apparatus as set forth in claim 12, which further comprises sixth means for deriving the plurality of data signals stored in the second means in synchronization with the clock pulse signal in response to a derived command.

15. An apparatus as set forth in claim 14, wherein the sixth means comprises an output buffer connected to one end of the string of the shift registers.

16. An apparatus as set forth in claim 1, wherein the third means includes a data input portion including a plurality of series shift register stages and an input control circuit for executing input control of the data input portion serially supplying the data signals in the input data portion in response to an input command.

17. An apparatus as set forth in claim 16, wherein the second means includes a plurality of shift register strings, each including plural series connected shift register stages, a first stage of each shift register string connected to respond to a bit in one of the shift register stages of the data input portion.

18. An apparatus as set forth in claim 17, which further includes a power supply circuit (E) connected to the data storing apparatus via a first diode ($D_1$), the power supply circuit supplying a power supply voltage to the data storing apparatus during normal operation of the power supply via the forward first diode, a battery connected to the data storing apparatus via a resistor (R) and a second diode, a DC voltage being supplied to the data storing apparatus via the second diode and resistor while the emergency occurs and the voltage from the power supply circuit is interrupted.

19. An apparatus as set forth in claim 1, which further includes a power supply circuit (E) connected to the data storing apparatus via a first diode ($D_1$), the power supply circuit supplying a power supply voltage to the data storing apparatus during normal operation of the power supply via the forward first diode, a voltage charged capacitor connected to the data storing apparatus via a resistor (R) and a second diode, the charged voltage being supplied to the data storing apparatus via the second diode and resistor while non-steady state occurs and the voltage from the power supply circuit is interrupted.

20. An apparatus as set forth in claim 17, wherein each shift resister stage of each shift register string includes a transmission gate for passing each of the data bits therethrough in response to the clock pulse signal derived from the first means and a pair of first and second inverters connected to the transmission gate and in parallel with each other in a mutually reverse direction, the first inverter having a higher current supplying capacity than the second inverter.

21. An apparatus as set forth in claim 17, wherein each shift register of each shift register stage string includes a transmission gate for passing each of the data bits therethrough in response to the clock pulse signal derived from the first means, a pair of first and second inverters connected in series with each other, and a feedback resistor connected between an input side of the first inverter and an output side of the second inverter.

22. An apparatus as set forth in claim 1, wherein the third means includes a string of plural series connected shift register stages, and a string of series connected counter stages for deriving a count indicative of position of each data signal stored in the shift register string, the count indication being derived by counting the number of clock pulses derived from the first means.

23. An apparatus as set forth in claim 16, wherein the data storing apparatus includes a plurality of said data storing apparatus connected in series with each other.

24. An apparatus as set forth in claim 3, wherein the number of the shift register stages in each shift register string corresponds to: $n = T_r/T_p$, where $T_r$ denotes a predetermined recording time interval during which data related to running of a vehicle are supplied to the corresponding data input portion, and $T_p$ denotes elapsed time from the occurrence time of the emergency for which the prior data are held.

25. An apparatus as set forth in claim 22, wherein each counter of the counter string includes a non-volatile memory portion.

26. An apparatus as set forth in claim 25, wherein the number of the counters in the counter string is $M = \log_2 N$, where N denotes the number of the shift register stages in the shift register string.

27. An apparatus as set forth in claim 6, wherein the first means supplies the clock pulse to each transmission gate of the shift register stages included in each shift register string, the clock pulse signal including first and second clock pulses, the first and second clock pulses having the same predetermined period ($T_1$) and inversed phase with respect to each other and being sequentially transmitted to each transmission gate.

28. An apparatus for storing data related to a state of a vehicle, comprising:
 a) first means for deriving a clock pulse signal having a predetermined period;
 b) second means for controlling a plurality of data signals indicative of the vehicle state, each data signal having a plurality of serial data bits, the data bits being sequentially supplied to the data storing apparatus in synchronization with the clock pulse signal;
 c) third means having plural data memory portions for storing respective bits of data of the data signal, the third means responding to the first and second means so that the respective bits of data are shifted in the data memory portions toward subsequent data memory portions of the third means in synchronization with the clock pulse signal; and
 d) fourth means for protectively holding the data stored in the third means while an emergency occurs.

29. An apparatus as set forth in claim 28, wherein the second means includes a plurality of data input terminals, each input terminal receiving in parallel plural data signals related to the vehicle state.

30. An apparatus as set forth in claim 28, wherein the second means includes an input terminal for serially receiving the data signals related to the vehicle state.

31. An apparatus for storing digital data derived from plural data sources of a vehicle, comprising:
  a) first means for deriving clock pulse signals, the clock pulse signals having the same frequency and reversed phase to each other;
  b) second means having plural data memory stages for storing respective bits of the data signals;
  c) third means for controlling coupling of plural digital data signals each having plural data bits to the third means in synchronization with the clock pulse signal and for shifting the plural data bits toward subsequent data bit memory stages of the second means in synchronization with the clock pulse signal; and
  d) fourth means for detecting an emergency state in the vehicle and for protectively holding the respective bits of the data signals in the plural memory stages when the emergency state occurs to present transfer thereof toward the subsequent data memory stages.

32. Apparatus for storing digital data indicative of the state of a machine at the time an emergency to the machine occurs comprising means for deriving plural multi-bit digital serial signal as each indicative of a condition of the machine, a clock source, means for sensing an emergency condition of the machine, multi-stage shift register means including plural serial shift register stages responsive to the plural serial signals and the clock source so a different bit storage stage of the shift register means stores a different bit of the plural serial signals, the shift register means being responsive to the plural serial signals and the clock source so the bits are shifted between the stages in response to the clock source so the bits progress between stages of the shift register means toward output terminal means thereof during non-emergency operation of the machine, and means responsive to the sensing means for preventing shifting of the bits between the stages and for causing the bits to remain in the stages where they were when the emergency condition was sensed until the emergency condition is no longer sensed.

33. The apparatus of claim 32 wherein each stage includes: volatile and non-volatile sections, and means responsive to the sensing means for transferring the data bit in the volatile section into the non-volatile section and for transferring the data bit in the non-voltage section back into the voltage section, the data bits being transferred between the voltage sections in response to the clock pulse signals.

34. The apparatus of claim 33 wherein the shift register means includes plural shift register sections each responsive to the clock source and a different one of the serial signals and including plural serial stages, each of said sections having a different output terminal on which the serial bits of the signal supplied to the section are derived in response to the clock source.

35. The apparatus of claim 34 wherein one of the sections includes an input serial shift register having n serial stages responsive to one of the serial signals, n intermediate serial shift registers each including m serial stages, and an output shift register having n serial stages; said input, output and intermediate shift registers being coupled to each other and the clock source so that in response to a signal from the clock source: a bit in stage j of the input register is transferred to stage (j+1) of the input register, a bit in stage k of the input register is transferred to the first stage of intermediate register k, a bit in stage i of intermediate register k is transferred to stage (i+1) of intermediate register k, a bit in stage m of intermediate register k is transferred to stage k of the output register, and a bit n stage h of the output register is transferred to stage (h+1) of the output register, where h, j and k are selectively each of 1 through n and i is selectively each of 1 through m.

36. The apparatus of claim 33 wherein the shift register means includes a shift register having m serial stages, the shift register having a first stage sequentially responsive to the serial bits of the plural signals and being responsive to the clock source so that bits of the plural signals are transferred from stage j to stage (j+1), where j is selectively all of the stages of the shift register, and means responsive to the serial signals supplied to the fist stage of the shift register for storing indications of data bits of the signals in the shift register.

37. An apparatus as set forth in claim 36, wherein the third means includes: a parallel-to- serial converter having a plurality of input terminals for receiving the plural data signals at the same time and converting each of the data signals into a serial data bit wavetrain and an input control circuit for executing control of the parallel-to-serial converter in response to an input command.

38. The apparatus of claim 37 wherein the means for storing includes plural counters.

* * * * *